United States Patent
Luetkemeyer et al.

(10) Patent No.: US 9,047,314 B1
(45) Date of Patent: Jun. 2, 2015

(54) CREATING AND USING DYNAMIC VECTOR CLASSES

(71) Applicant: The MathWorks, Inc., Natick, MA (US)

(72) Inventors: Kelly G. Luetkemeyer, Upton, MA (US); Robert P. Comer, Concord, MA (US)

(73) Assignee: The MathWorks, Inc., Natick, MA (US)

( * ) Notice: Subject to any disclaimer, the term of this patent is extended or adjusted under 35 U.S.C. 154(b) by 177 days.

(21) Appl. No.: 13/628,768

(22) Filed: Sep. 27, 2012

(51) Int. Cl.
*G06F 17/30* (2006.01)

(52) U.S. Cl.
CPC .................. *G06F 17/30241* (2013.01)

(58) Field of Classification Search
CPC .................. G06F 17/30241; G06F 17/30271
USPC ........... 707/999.101, 999.002, 801, 802, 793, 707/804; 706/19; 84/616; 386/297; 345/506, 418
See application file for complete search history.

(56) References Cited

U.S. PATENT DOCUMENTS

| | | | | |
|---|---|---|---|---|
| 5,479,266 A | * | 12/1995 | Young et al. | 386/297 |
| 6,446,063 B1 | * | 9/2002 | Chen et al. | 707/999.002 |
| 7,177,882 B2 | * | 2/2007 | Xie et al. | 1/1 |
| 7,777,125 B2 | * | 8/2010 | Platt et al. | 84/616 |
| 8,411,094 B2 | * | 4/2013 | Falchetto et al. | 345/506 |
| 2003/0208503 A1 | * | 11/2003 | Roccaforte | 707/999.101 |
| 2008/0033897 A1 | * | 2/2008 | Lloyd | 706/19 |

* cited by examiner

*Primary Examiner* — James Trujillo
*Assistant Examiner* — Miranda Huang
(74) *Attorney, Agent, or Firm* — Harrity & Harrity, LLP

(57) ABSTRACT

A device may store a data structure including information identifying a geometric relationship between first and second coordinate values of a first data type. The data structure may also include a first array of a first length that includes the first coordinate value located at a position identifiable by a reference value. The data structure may also include a second array of a second length that includes the second coordinate value located at a position identifiable by the reference value. The data structure may also include a third array of a third length that includes an attribute value of a second data type, located at a position identifiable by the reference value. The device may receive an indication that one of the lengths is to be modified, and may modify the data structure so that the first length, the second length, and the third length are equivalent.

20 Claims, 13 Drawing Sheets

CREATING AND USING DYNAMIC VECTOR CLASSES

DETAILED DESCRIPTION

Figure 1:
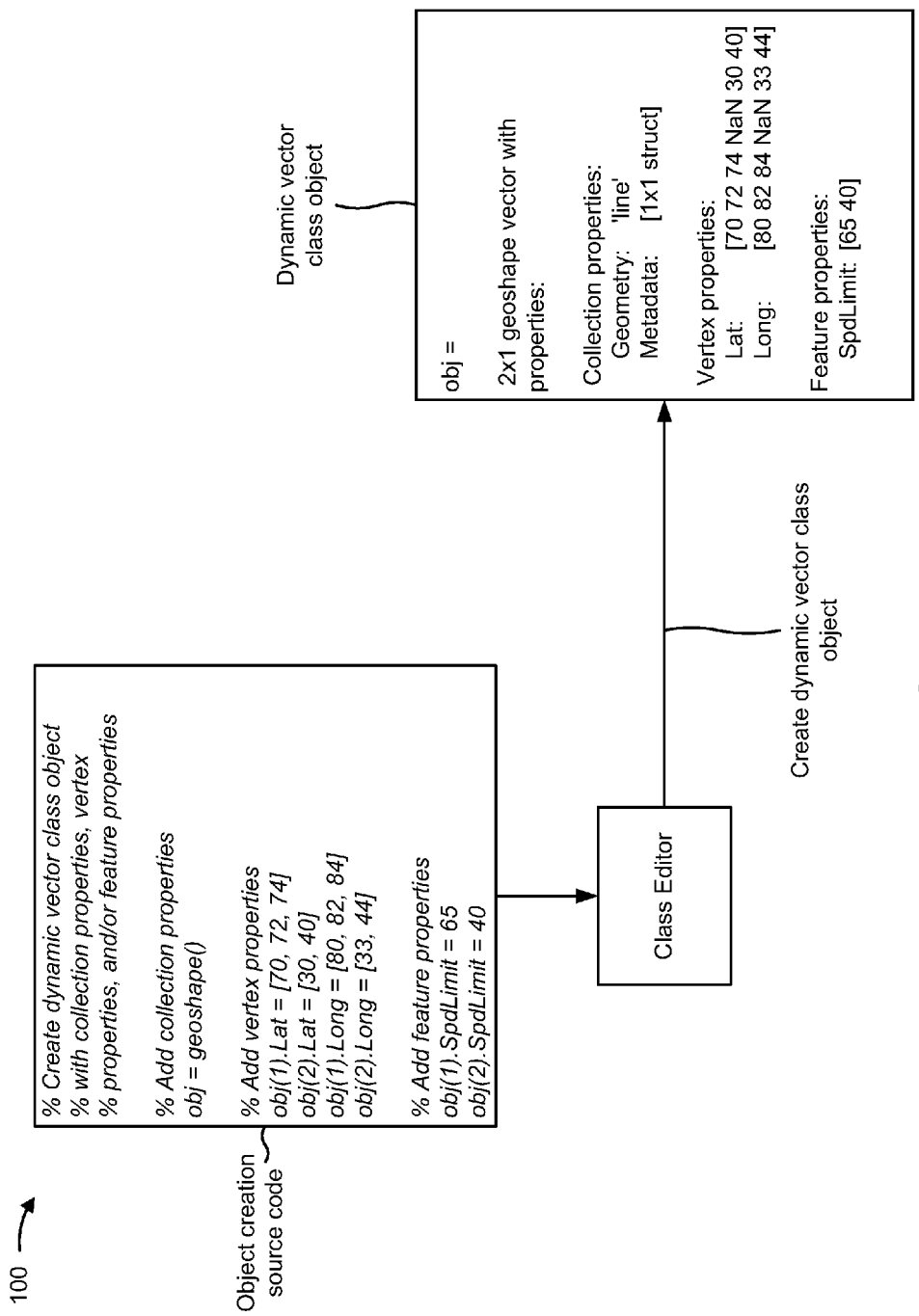
FIG. 1 is a diagram of an example overview of an implementation described herein.

The following detailed description refers to the accompanying drawings. The same labels and/or reference numbers in different drawings may identify the same or similar elements.

Systems and/or methods, described herein, may facilitate the creation and use of dynamic vector class objects. A dynamic vector class object may store information for an object, created using an object-oriented programming language, using arrays that store the information differently based on whether the information is a vertex property, a feature property, or a collection property of the object.

Vertex property values may be stored in a vertex array of the dynamic vector class object. Multiple vertex property values may be stored in a single element of the vertex array. In other words, multiple vertex property values may be indexed in the vertex array using a single index value. Feature property values may be stored in a feature array of the dynamic vector class object. Each feature property value may be stored in a single element of the feature array. In other words, a single feature property value may be indexed in the feature array using a single index value. Collection property values may include information for multiple other property values (e.g., multiple vertex property values and/or multiple feature property values), or for the entire dynamic vector class object.

Systems and/or methods, as described herein, may use a computing environment, such as a technical computing environment (TCE), for performing computing operations. A TCE may include any hardware and/or software based logic that provides a computing environment that allows tasks to be performed (e.g., by users) related to disciplines, such as, but not limited to, mathematics, science, engineering, medicine, and business. The TCE may include a text-based environment (e.g., MATLAB® software), a graphically-based environment (e.g., Simulink® software, Stateflow® software, SimEvents® software, etc., by The MathWorks, Inc.; VisSim by Visual Solutions; LabView® by National Instruments; etc.), or another type of environment, such as a hybrid environment that may include, for example, a text-based environment and a graphically-based environment.

The TCE may be integrated with or operate in conjunction with a graphical modeling environment, which may provide graphical tools for constructing models, systems, or processes. The TCE may include additional tools, such as tools designed to convert a model into an alternate representation, such as source computer code, compiled computer code, or a hardware description (e.g., a description of a circuit layout). In some implementations, the TCE may provide this ability using graphical toolboxes (e.g., toolboxes for signal processing, image processing, color manipulation, data plotting, parallel processing, etc.). In some implementations, the TCE may provide these functions as block sets. In some implementations, the TCE may provide these functions in another way.

Models generated with the TCE may be, for example, models of a physical system, a computing system, an engineered system, an embedded system, a biological system, a chemical system, etc. A model generated with the TCE may include, for example, any equations, assignments, constraints, computations, algorithms, and/or process flows. The model may be implemented as, for example, time-based block diagrams (e.g., via the Simulink software), discrete-event based diagrams (e.g., via the SimEvents software), dataflow diagrams, state transition diagrams (e.g., via the Stateflow software), software diagrams, a textual array-based and/or dynamically typed language (e.g., via the MATLAB software), and/or any other type of model.

As previously mentioned, an example implementation of the TCE may use one or more text-based products, such as textual modeling environments. For example, a text-based modeling environment, may be implemented using additional products such as, but not limited to Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some implementations, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In some implementations, the text-based modeling environment may include a dynamically typed language that may be used to express problems and/or solutions in mathematical notations. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on whole aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

In some implementations, the TCE may be implemented in a graphically-based modeling environment using products such as, but not limited to: VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment.

FIG. 1 is a diagram of an example overview 100 of an implementation described herein. As illustrated in FIG. 1, a class editor may receive object creation source code specifying the creation of a dynamic vector class object, and may create a dynamic vector class object based on the source code. The class editor may include, for example, a computing device that hosts a TCE.

As further illustrated in FIG. 1, the object creation source code may specify collection properties, vertex properties, and feature properties for the dynamic vector class object. The class editor may store the properties in the dynamic vector class object based on the source code. For example, the dynamic vector class object may store collection properties, vertex properties, which may be stored in vertex arrays, and feature properties, which may be stored in feature arrays.

The collection properties may specify, for example, a relationship between other property values in the dynamic vector class object (e.g., a line relationship between coordinate pairs).

The vertex properties may include multiple vertex property values indexed, in a vertex array, using a single index value. A delimiter may be used to separate vertex property values indexed using a different index value (e.g., not a number, or NaN, as illustrated). As an example, in the Lat vertex array, the values 70, 72, and 74 may be referenced by index value 1 (e.g., based on obj(1).Lat=70, 72, 74), and the values 30 and 40 may be referenced by index value 2 (e.g., based on obj(2).Lat=30, 40). The values of (70, 72, 74) and (30, 40) may be separated by the NaN delimiter.

The feature properties may include multiple feature property values, each referenced, in a feature array, by a different index value. For example, in the SpdLimit feature array, the value 65 may be referenced by index value 1 (e.g., based on obj(1).SpdLimit=65), and the value 40 may be referenced by index value 2 (e.g., based on obj(2).SpdLimit=40).

In the created dynamic vector class object, each feature value may be associated with multiple vertex values. For example, the SpdLimit feature property value of 65, the Lat vertex property values of 70, 72, and 74, and the Long vertex property values of 80, 82, and 84 are all indexed in their respective arrays by an index value of 1. The common index value may be used to associate these values. For example, the SpdLimit, Lat, and Long arrays may indicate that a road that traverses latitude and longitude coordinates of (70, 80), (72, 82), and (74, 84) may have a speed limit of 65.

When creating and/or modifying the dynamic vector class object, the class editor may synchronize the length of the vertex arrays and the feature arrays so that they have an equal quantity of elements, where each element is indexed by a different index value. For example, the Lat vertex array, the Long vertex array, and the SpdLimit feature array all have two elements. The first element of the Lat vertex array is (70, 72, 74), the first element of the Long vertex array is (80, 82, 84), and the first element of the SpdLimit feature array is 65. The second element of the Lat vertex array is (30, 40), the second element of the Long vertex array is (33, 44), and the second element of the SpdLimit feature array is 40.

The class editor may also synchronize the quantity of vertex property values included in each element. For example, the first elements of the Lat and Long vertex arrays include three vertex property values (70, 72, 74; and 80, 82, 84), and the second elements of the Lat and Long vertex arrays include two vertex property values (30, 40; and 33, 44). Additionally, or alternatively, the dynamic vector class object may store property values in the arrays as a concatenated array of values, rather than a comma-separated list of values.

Figure 2:
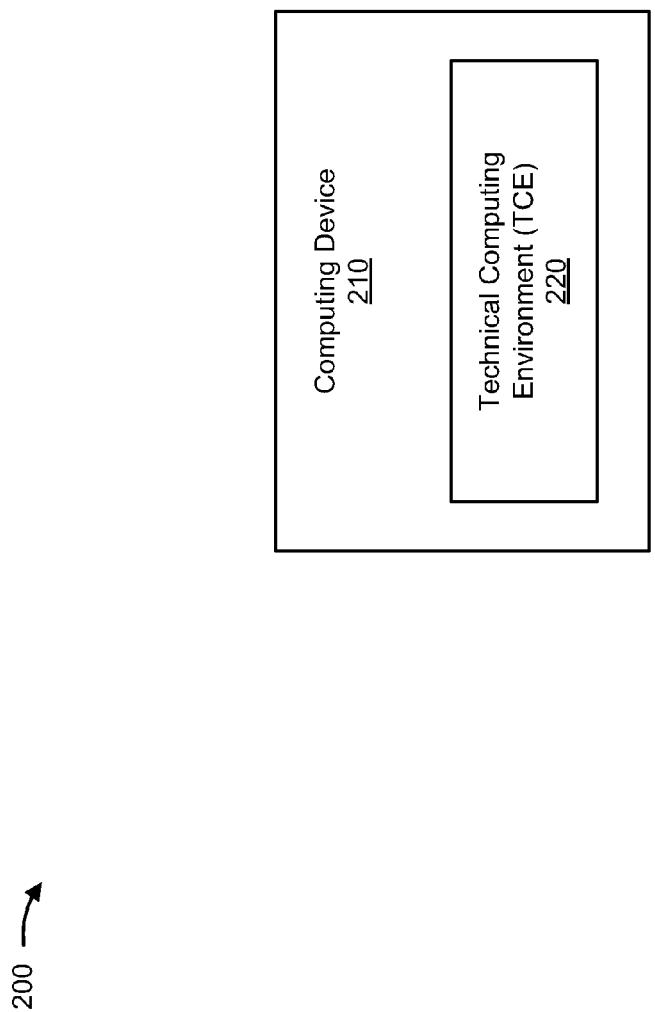
FIG. 2 is a diagram of an example environment in which systems and/or methods described herein may be implemented.

FIG. 2 is a diagram of an example environment 200 in which systems and/or methods described herein may be implemented. As illustrated, environment 200 may include a computing device 210 that hosts TCE 220.

Computing device 210 may include one or more devices that gather, process, search, store, and/or provide information in a manner similar to that described herein. For example, computing device 210 may include a server, a workstation, a mainframe, a computer (e.g., a desktop computer, a laptop computer, a tablet computer, smart phone, etc.), and/or some other type of computational device. Computing device 210 may generate, compile, and/or execute code, such as code relating to the creation, modification, and/or use of a dynamic vector class object.

Computing device 210 may host a TCE 220. TCE 220 may include hardware-based logic or a combination of hardware and software-based logic that provides a computing environment. TCE 220 may permit a user to perform tasks related to a discipline or a domain. For example, TCE 220 may pertain to mathematics, science, engineering, medicine, business, and/or another type of discipline or domain in a manner similar to that described above. In some implementations, TCE 220 may be hosted by another device, such as a server, that is located remotely from computing device 210.

In some implementations, TCE 220 may include client-side components and/or server-side components. The client-side components may be executed at computing device 210, while the server-side components may be executed at a server (not illustrated), which may be in communication with computing device 210 via a network. In this way, implementations described herein may be executed (e.g., by TCE 220) in a distributed computing environment and/or a parallel computing environment.

Although FIG. 2 illustrates example components of environment 200, in some implementations, environment 200 may include additional components, fewer components, different components, or differently arranged components than those illustrated in FIG. 2.

Figure 3:
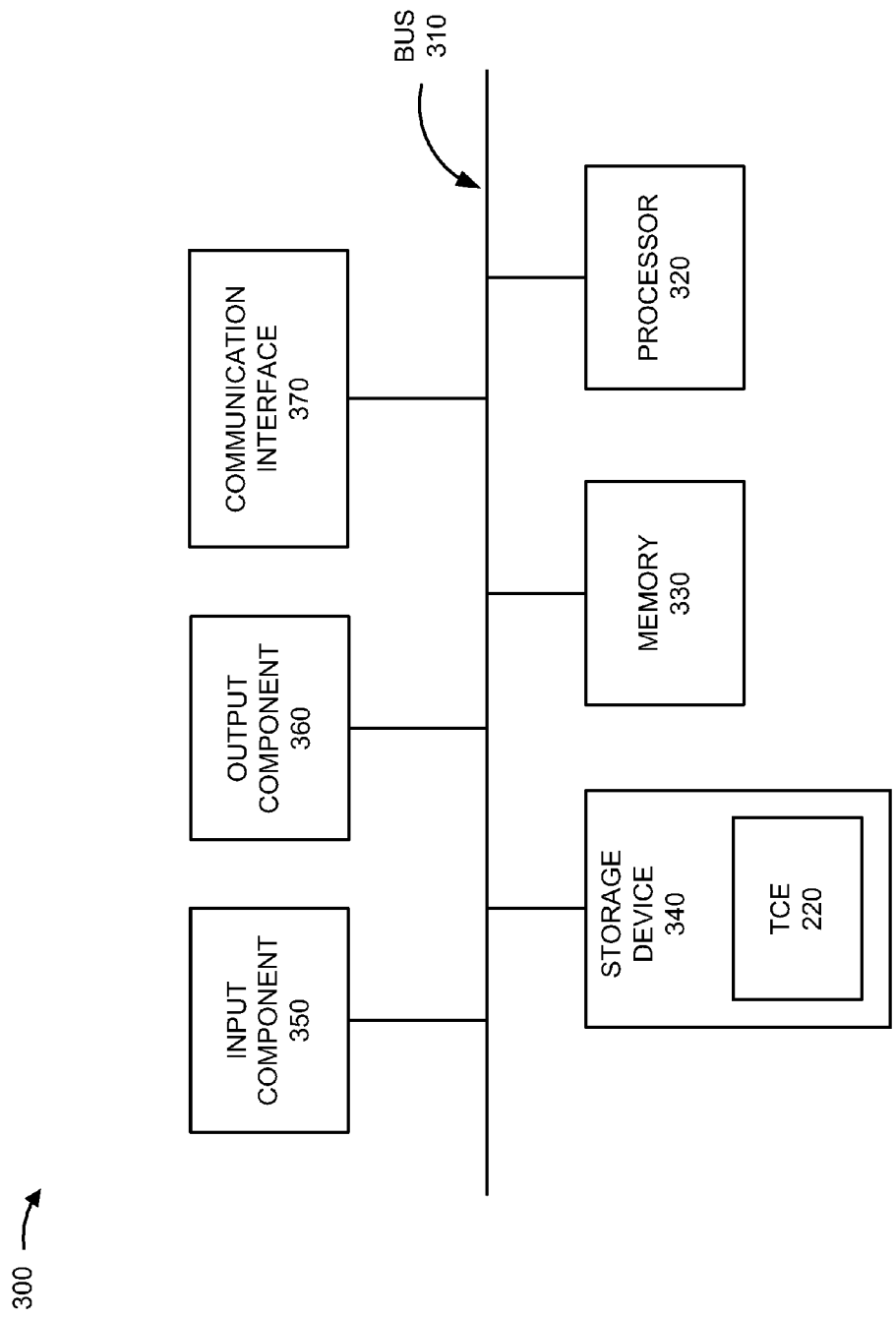
FIG. 3 is a diagram of example components of a device of FIG. 2, according to some implementations described herein.

FIG. 3 is a diagram of example components of a device 300, which may correspond to computing device 210. As illustrated in FIG. 3, device 300 may include a bus 310, a processor 320, a memory 330, a storage device 340, an input component 350, an output component 360, and/or a communication interface 370.

Bus 310 may permit communication among the other components of device 300. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphical processing unit (GPU), a processing core, an application specific integrated circuit (ASIC), an application specific instruction-set processor (ASIP), a system-on-chip (SOC), a programmable logic device (PLD), a chipset, and/or a field programmable gate array (FPGA).

Memory 330 may store data and/or instructions related to the operation and use of device 300. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage device 340 may store data and/or software related to the operation and use of device 300. For example, storage device 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage device 340 may also include a storage device external to and/or removable from device 300, such as a Universal Serial Bus (USB) memory stick, a hard disk, etc. In an implementation, as illustrated, storage device 340 may store TCE 220.

Input component 350 may permit the user and/or another device to input information into device 300. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit device 300 to output information to the user and/or another device. For example, output component 360 may include a display, a speaker, a light emitting diode (LED), a haptic device, a tactile device, an output port, and/or some other type of output component.

Communication interface 370 may permit device 300 to communicate with other devices, networks, and/or systems. Communication interface 370 may include a transceiver-like component. For example, communication interface 370 may include an Ethernet interface, an optical interface, a coaxial interface, a radio interface, and/or some other type of wireless and/or wired interface.

As will be described in detail below, device 300 may perform certain operations relating to implementations described herein. Device 300 may perform these operations in response to processor 320 executing software instructions (e.g., computer program(s)) contained in a computer-readable medium, such as memory 330 and/or storage device 340. A computer-readable medium may be defined as a non-transitory memory device. A memory device may include space within a single physical memory device or spread across multiple physical memory devices. The software instructions may be read into memory 330 from another computer-readable medium, such as storage device 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 illustrates example components of device 300, in some implementations, device 300 may include additional components, fewer components, different components, or differently arranged components than those illustrated in FIG. 3. Additionally, or alternatively, one or more components of device 300 may perform one or more tasks described as being performed by one or more other components of device 300.

Figure 4:
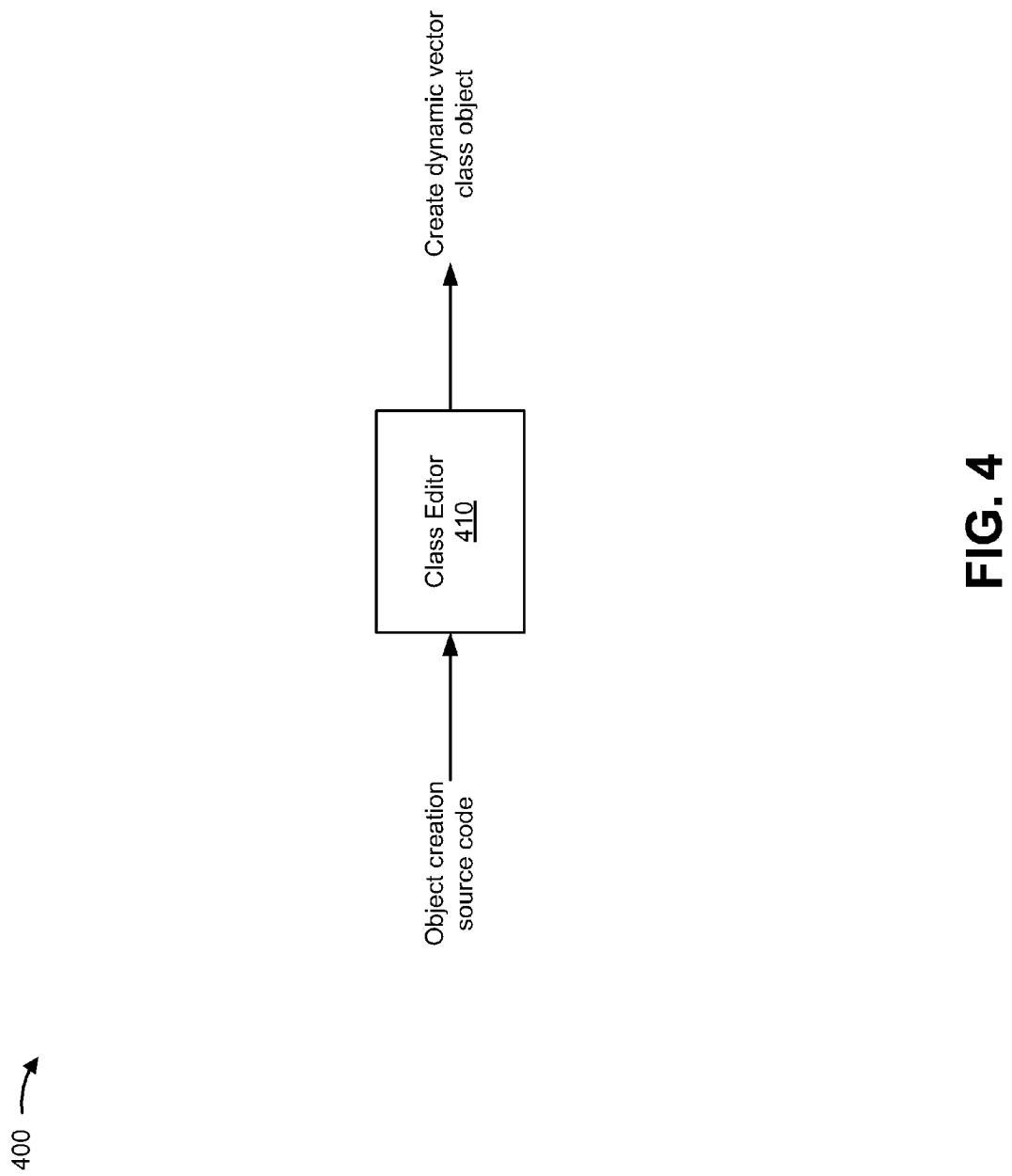
FIG. 4 is a diagram of an example functional component of a device of FIG. 2, according to some implementations described herein.

FIG. 4 is a diagram of an example functional component of a device 400, which may correspond to computing device 210. As shown in FIG. 4, device 400 may include a class editor 410.

As illustrated in FIG. 4, class editor 410 may receive object creation source code specifying the creation of a dynamic vector class object, and may create a dynamic vector class object based on the source code. The object creation source code may specify collection properties, vertex properties, and feature properties for the dynamic vector class object. For example, the collection properties may specify properties that apply to the dynamic vector class object as a whole, and/or properties that apply to other properties and/or arrays (e.g., vertex/feature properties and/or arrays). The vertex properties may include multiple vertex property values indexed, in a vertex array, using a single index value. The feature properties may include multiple feature property values, each indexed, in a feature array, by a different index value. Class editor 410 may determine the collection properties, the vertex properties, and the feature properties based on the source code, and may create the dynamic vector class object based on the source code and the properties.

Although FIG. 4 illustrates example functional components of device 400, in some implementations, device 400 may include additional functional components, fewer functional components, different functional components, or differently arranged functional components than those illustrated in FIG. 4.

Figure 5:
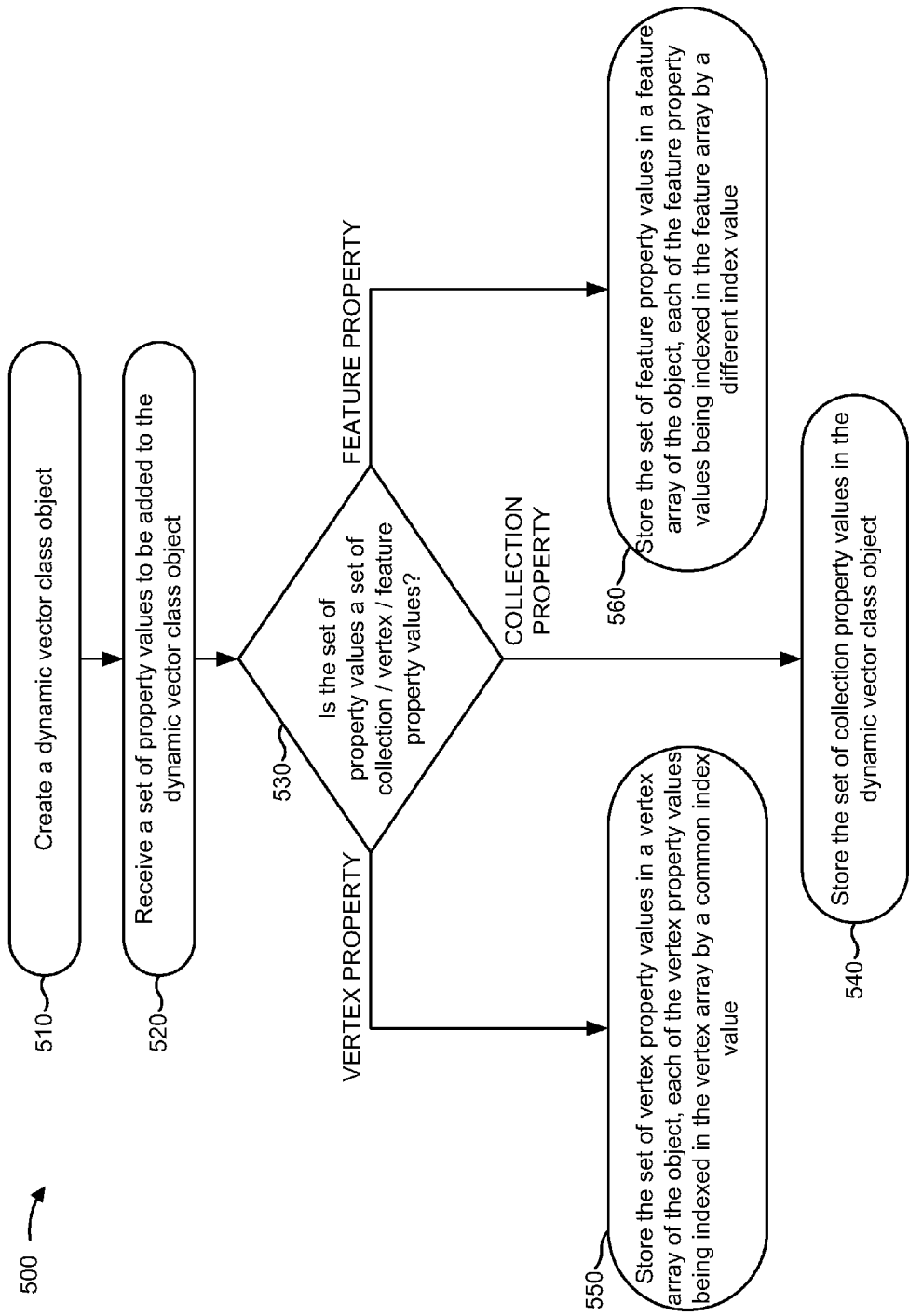
FIG. 5 is a flow chart of an example process relating to creating and/or modifying a dynamic vector class object.

FIG. 5 is a flow chart of an example process 500 relating to creating and/or modifying a dynamic vector class object. In some implementations, process 500 may be performed by a device, or a group of devices, separate from, or in combination with, computing device 210.

As shown in FIG. 5, process 500 may include creating a dynamic vector class object (block 510). Class editor 410 may create the dynamic vector class object (sometimes referred to herein as an "object") based on receiving, compiling, and/or executing source code. In some implementations, the source code may specify a dynamic vector class type of the object (sometimes referred to herein as a "class type"). The class type may include, for example, a geopoint class, a mappoint class, a geoshape class, or a mapshape class. Other or different class types are also possible. Class editor 410 may create the dynamic vector class object based on the class type, as described in more detail in connection with FIG. 6.

As further shown in FIG. 5, process 500 may include receiving a set of property values to be added to the dynamic vector class object (block 520). In some implementations, class editor 410 may add property values to the dynamic vector class object based on source code. For example, the source code may include an instruction to add a property value to the object. The property value may be, for example, a collection property value, a vertex property value, or a feature property value.

As still further shown in FIG. 5, process 500 may include determining whether the set of property values is a set of collection property values, vertex property values, or feature property values (block 530). In some implementations, class editor 410 may make the determination based on source code used to create the object. For example, the source code may specify a dynamic vector class type of the object (e.g., a geopoint class, a mappoint class, a geoshape class, or a mapshape class). Additionally, or alternatively, the source code may specify an operation and/or a syntax used to add a property value to the object. Class editor 410 may determine whether the set of property values is a set of collection property values, vertex property values, or feature property values based on the dynamic vector class type, the operation, and/or the syntax.

If class editor 410 determines that the set of property values is a set of collection property values (block 530—COLLECTION PROPERTY), process 500 may include storing the set of collection property values in the dynamic vector class object (block 540). The set of collection property values may identify relationships between other property values stored in the dynamic vector class object, and/or may describe the dynamic vector class object.

If class editor 410 determines that the set of property values is a set of vertex property values (block 530—VERTEX PROPERTY), process 500 may include storing the set of vertex property values in a vertex array of the object, each of the vertex property values being indexed in the vertex array by a common index value (block 550). The set of vertex property values may include, for example, a set of latitude/longitude or X/Y coordinate pairs, and multiple coordinate pairs may be referenced by a single index value. In other words, multiple vertex property values may be included in each vertex array element, where an element is referenced by a single index value. Example vertex property values may include coordinates, such as latitude and longitude or X and Y coordinates.

If class editor 410 determines that the set of property values is a set of feature property values (block 530—FEATURE PROPERTY), process 500 may include storing the set of feature property values in a feature array of the object, each of the feature property values being indexed in the feature array by a different index value (block 560). The set of feature property values may include a set of attributes corresponding to, for example, a set of latitude/longitude or X/Y coordinate pairs, and a single attribute may be referenced by a single index value. In other words, only one feature property value may be included in each feature array element, where an element is referenced by a single index value. Example feature property values may include a name, an owner, a description, an attribute, etc.

While a series of blocks has been described with regard to FIG. 5, the order of the blocks may be modified in some implementations. Additionally, or alternatively, non-dependent blocks may be performed in parallel.

Figure 6:
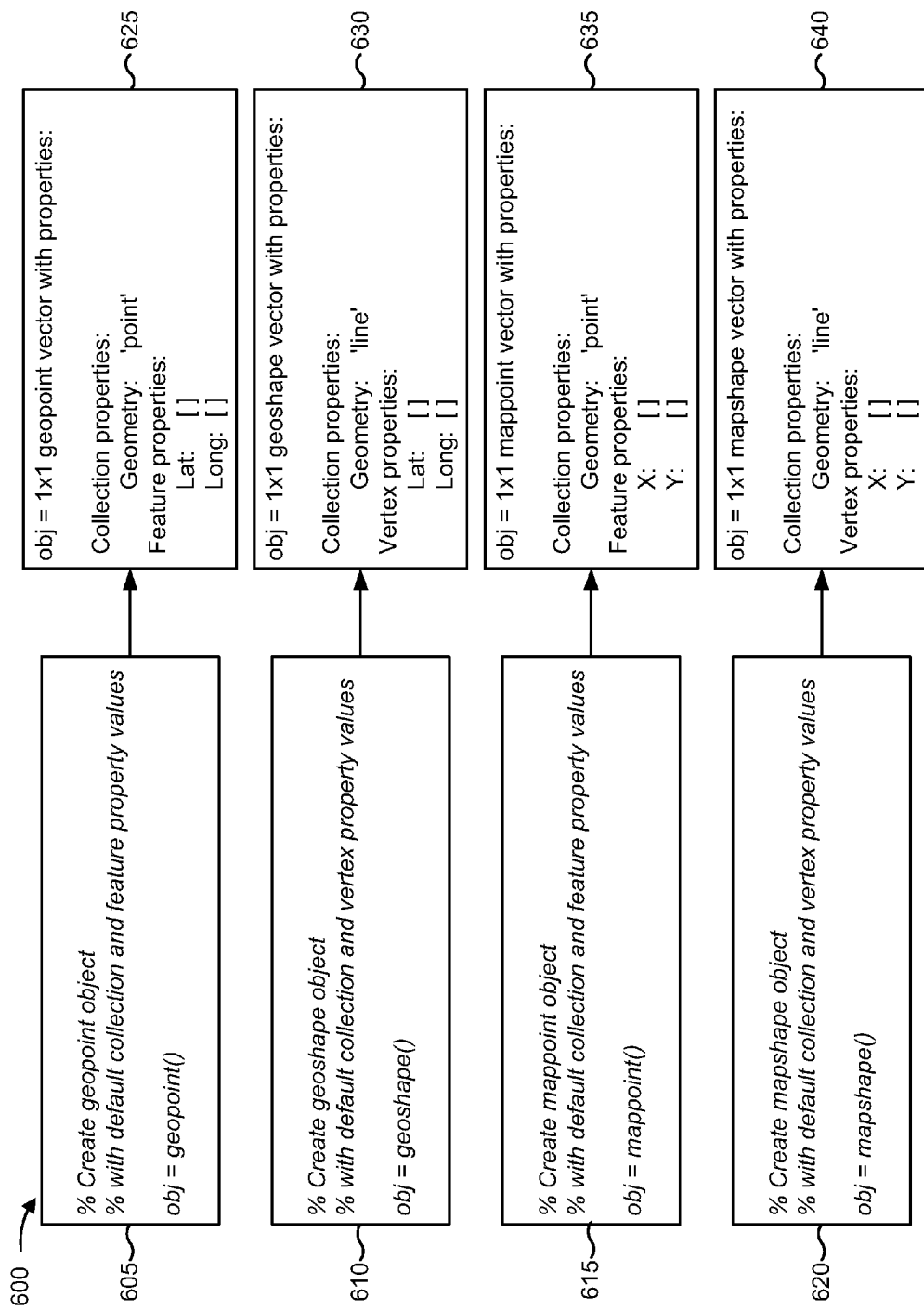
FIGS. 6-9 are diagrams of example implementations relating to the process illustrated in FIG. 5.

FIG. 6 is a diagram of an example implementation 600 relating to process 500, illustrated in FIG. 5. FIG. 6 illustrates an example implementation 600 for creating a dynamic vector class object, and initializing the dynamic vector class object with default collection property values, default feature property values, and/or default vertex property values.

As illustrated in FIG. 6, the source code may specify a dynamic vector class type of the object. The dynamic vector class type may include, for example, a geopoint class (shown in box 605), a geoshape class (shown in box 610), a mappoint class (shown in box 615), or a mapshape class (shown in box 620).

As further illustrated in FIG. 6, the dynamic vector class object may include collection properties, feature properties, and/or vertex properties (shown in boxes 625-640). In some implementations, class editor 410 may initialize the object with default collection, feature, and/or vertex properties based on the class type of the object and/or the source code used to create the object.

For example, as shown in box 605, the code obj=geopoint( ) may be used to create an object (obj) of the geopoint class type. As shown in boxes 610-620, similar code may be used to create an object of the geoshape, mappoint, and mapshape classes.

The geopoint class and the geoshape class may include property values that represent geographic points, such as latitude and longitude coordinates. Class editor 410 may initialize the geopoint or geoshape class with an array of latitude coordinates and an array of longitude coordinates, as shown in boxes 625 and 630.

As shown in box 625, in the geopoint class, the latitude and longitude arrays may be feature properties, meaning that each latitude coordinate is referenced by a different index value, and each longitude coordinate is referenced by an index value that corresponds to each of the different latitude index values.

As shown in box 630, in the geoshape class, the latitude and longitude arrays may be vertex properties, meaning that multiple latitude coordinates may be referenced by a single index value, and the multiple latitude coordinates may correspond to multiple longitude coordinates referenced by the single index value. Class editor 410 may synchronize the quantity of latitude and longitude coordinates referenced by the single index value. For example, if the single index value references a set of three latitude coordinates, then the single index value may also reference a set of three corresponding longitude coordinates.

The mappoint class and the mapshape class may include property values that represent planar points, such as X and Y coordinates. Class editor 410 may initialize the mappoint or mapshape class with an array of X coordinates and an array of Y coordinates, as shown in boxes 635 and 640.

As shown in box 635, in the mappoint class, the X and Y coordinate arrays may be feature properties, and may be treated in the same manner as the latitude and longitude coordinate arrays of the geopoint class, discussed above.

As shown in box 640, in the mapshape class, the X and Y coordinate arrays may be vertex properties, and may be treated in the same manner as the latitude and longitude coordinate arrays of the geoshape class, discussed above.

In some implementations, class editor 410 may initialize properties and/or arrays of the object with a specified data type. A data type may refer to a classification identifying one or various types of data, that determines the possible values for that type, the operations that can be performed on values of that type, the meaning of the data, and/or the way that values of that type can be stored. A data type may include, for example, an integer, a floating point (float), a Boolean (or logical), a numeric, a string, a single, a double, an array or vector of one of these data types, etc. In some implementations, class editor may initialize the latitude, longitude, X, and/or Y arrays with a specified data type of numeric, float, single, double, and/or integer. Additionally, or alternatively, class editor 410 may force data added to and/or included in the array to be of the specified data type.

As further shown in FIG. 6, class editor 410 may initialize the dynamic vector class object with collection properties, as shown in boxes 625-640. A collection property may be denoted for the entire object, and not for individual elements of the object. In some implementations, a collection property may include only one value per object class. By using collection properties, class editor 410 may use less memory to store the object because the collection property need only be stored once, rather than one time for each element.

In some implementations, a collection property may include a geometric relationship between coordinates of the object. For example, the geometric relationship may be a point relationship, a line relationship, or a polygon relationship. The point relationship may associate a single latitude/X coordinate with a single longitude/Y coordinate, and may associate each latitude/longitude or X/Y coordinate pair with a single index value. The line relationship and the polygon relationship may associate a single latitude/X coordinate with a single longitude/Y coordinate, and may associate multiple latitude/longitude or X/Y coordinate pairs with a single index value.

When multiple coordinate pairs with a line relationship are plotted, the plot may connect the points indicated by each coordinate pair, but may not directly connect a first point and a last point (e.g., without any intervening points) when there are more than two points (e.g., may connect point 1 to point 2, and may connect point 2 to point 3, but may not directly connect point 3 to point 1). When multiple coordinate pairs with a polygon relationship are plotted, the plot may connect the points indicated by each coordinate pair, and may directly connect a first point and a last point when there are more than two points (e.g., may connect point 1 to point 2, may connect point 2 to point 3, and may connect point 3 to point 1).

In some implementations, class editor 410 may specify a default geometric relationship for the object based on the class type of the object. For example, class editor 410 may initialize an object of the geopoint and mappoint classes to include a default geometric relationship of a point relationship, as shown in boxes 625 and 635. As another example, class editor 410 may initialize an object of the geoshape and mapshape classes to include a default geometric relationship of a line relationship or a polygon relationship, as shown in boxes 630 and 640.

In some implementations, class editor 410 may add a non-default geometric relationship to the object using source code. For example, the following source code specifies a line relationship for a dynamic vector class object (obj):

obj.Geometry='line'.

Although FIG. 6 illustrates example information, such as source code and object properties, of implementation 600, some implementations may include additional information, less information, or different information than illustrated in FIG. 6.

Figure 7:
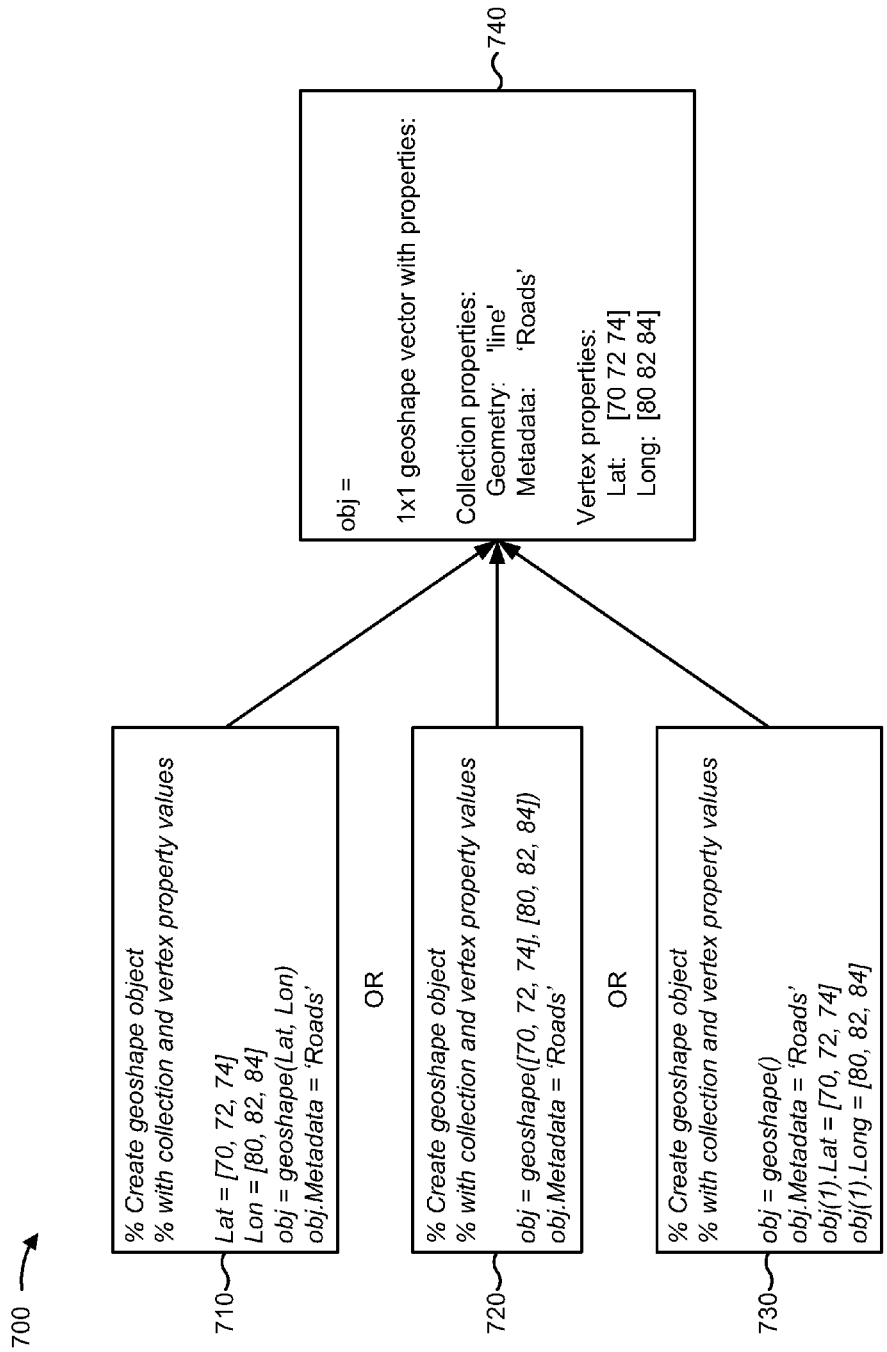

FIG. 7 is a diagram of an example implementation 700 relating to process 500, illustrated in FIG. 5. FIG. 7 illustrates an example implementation 700 for creating a geoshape dynamic vector class object using collection property values and vertex property values.

As illustrated in FIG. 7, class editor 410 may use different source code syntax to create a dynamic vector class object, as shown in boxes 710-730. For example, the source code may specify collection property values and vertex property values to add to the object.

In some implementations, the collection property may include metadata associated with the object. For example, the metadata may include information associated with the object, such as a description of the object. As shown in boxes 710-730, class editor 410 may add metadata to the object using, for example, the following source code, where obj is a dynamic vector class object:

obj.Metadata='Roads'.

As shown in box 740, the metadata may be added to the object as a collection property.

In some implementations, the vertex property may include coordinates associated with the object. For example, in the geoshape class, the vertex property may include latitude and longitude coordinates, as shown in box 740. As another example, in the mapshape class, the vertex property may include X and Y coordinates. In the geopoint and mappoint classes, the coordinates may be feature properties rather than vertex properties.

Class editor 410 may determine whether a property to be added to an object is a collection property, a vertex property, or a feature property based on the class type of the object. For example, the object may include pre-determined collection properties, such as geometry and metadata. Additionally, or alternatively, some class types (such as the geopoint class and mappoint classes) may include feature properties, and may not includes vertex properties. Other class types (such as the geoshape and mapshape classes) may include feature properties and vertex properties.

Although FIG. 7 illustrates example information, such as source code and object properties, of implementation 700, some implementations may include additional information, less information, or different information than illustrated in FIG. 7.

Figure 8:
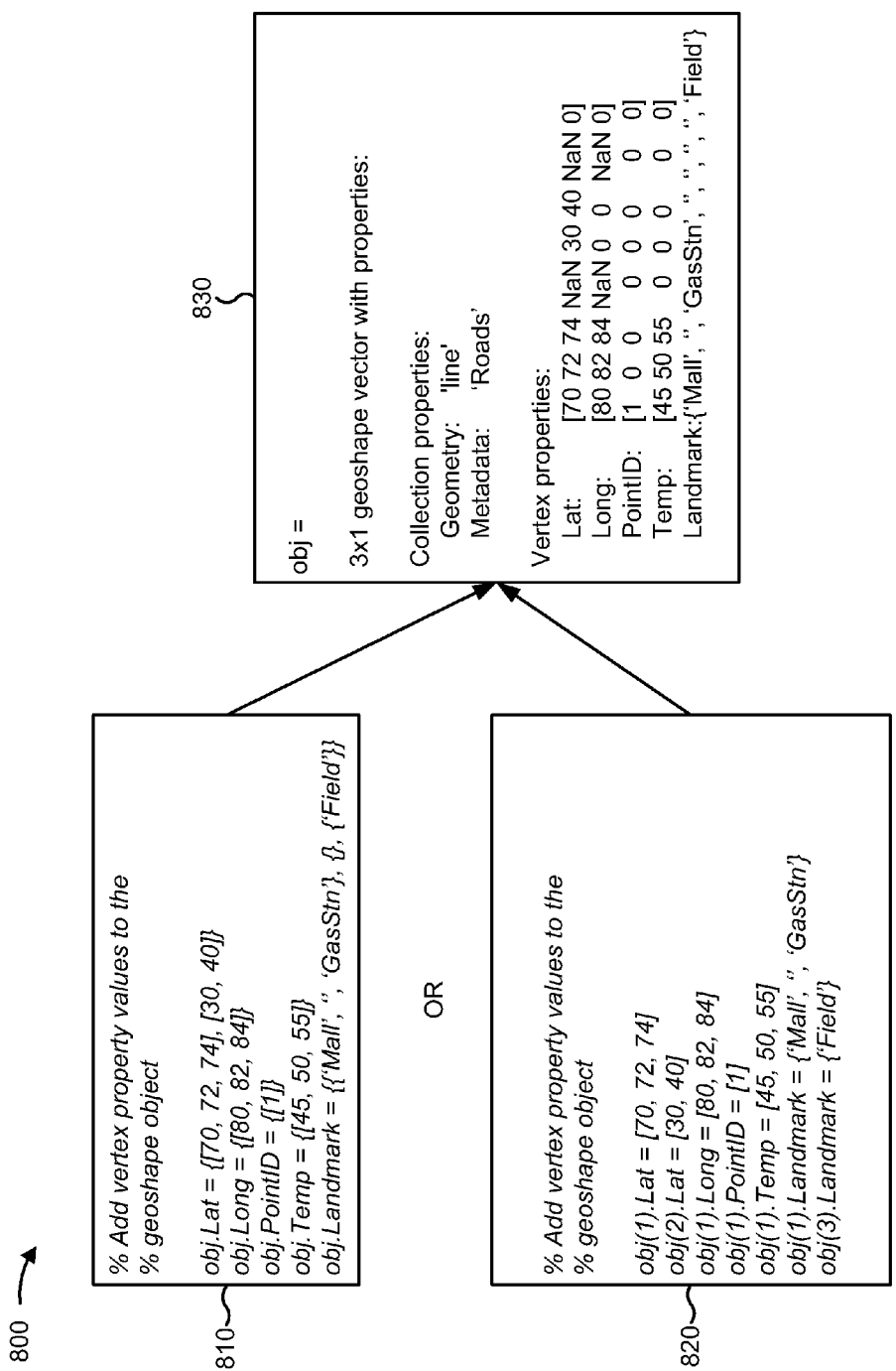

FIG. 8 is a diagram of an example implementation 800 relating to process 500, illustrated in FIG. 5. FIG. 8 illustrates an example implementation 800 for adding vertex property values to a geoshape object.

As illustrated in FIG. 8, class editor 410 may use different source code syntax to add vertex properties to a dynamic vector class object, as shown in boxes 810-820. Class editor 410 may determine that the property to be added to the object is a vertex property based on the source code syntax.

In some implementations, the source code may reference an object array without using an index value, as shown in box 810:

obj.Lat= . . .
obj.Long= . . .
obj.PointID= . . .
obj.Temp= . . .
obj.Landmark= . . .

Additionally, or alternatively, the source code may reference an element of the object array by using an index value, as shown in box 820:

obj(1).Lat= . . .
obj(2).Lat= . . .
obj(1).Long= . . .
obj(1).PointID= . . .
obj(1).Temp= . . .
obj(1).Landmark= . . .
obj(3).Landmark= . . .

Code editor 410 may determine whether the property to be added is a vertex property or a feature property based on an intrinsic rule. The intrinsic rule may depend on whether the source code references an object array without using an index value (box 810) or references an element of the object array using an index value (box 820).

For example, when the source code references an object array without using an index value (box 810), code editor 410 may determine that the property value to be added to the object is a vertex property when the value is a cell array of numeric (e.g., integers, floats, doubles, etc.) values or logical (e.g., Boolean) values. A cell array may store different data types together in an array (the cell array), and may be created using curly braces, as shown in box 810:

obj.Lat={[70, 72, 74],[30, 40]}
obj.Long={[80, 82, 84]}
obj.PointID={[1]}
obj.Temp={[45, 50, 55]}.

Additionally, or alternatively, when the source code references an object array without using an index value (box 810), code editor 410 may determine that the property value to be added to the object is a vertex property when the value is a cell array containing a cell array of strings:

obj.Landmark={{'Mall', ' ', 'GasStn'}, { }, {'Field'}}.

The result of adding these vertex properties to the object is shown in the vertex properties of box 830.

When the source code references an element of the object array by using an index value (box 820), code editor 410 may determine that the property value to be added to the object is a vertex property when the value is a numeric or logical vector:

obj(1).Lat=[70, 72, 74]
obj(2).Lat=[30, 40]
obj(1).Long=[80, 82, 84].

Additionally, or alternatively, when the source code references an element of the object array by using an index value (box 820), code editor 410 may determine that the property value to be added to the object is a vertex property when the value is a cell array containing numeric or logical vectors:

obj(1).PointID={1}
obj(1).Temp={45, 50, 55}.

Additionally, or alternatively, when the source code references an element of the object array by using an index value (box 820), code editor 410 may determine that the property value to be added to the object is a vertex property when the value is a cell array of strings:

obj(1).Landmark={'Mall', ' ', 'GasStn'}
obj(3).Landmark={'Field'}.

The result of adding these vertex properties to the object is shown in the vertex properties of box 830.

In a vertex array, multiple values (e.g., a concatenated array of values) in the vertex array may be referenced by a single index value. When creating a vertex array, class editor 410 may use a separator value to separate properties indexed by different index values. Class editor 410 may use a separator value that is based on the data type in the vertex array. In some implementations, class editor 410 may use "NaN" (not a number) as a separator for single or double vector data types, may use "0" as a separator for integer vector data types, may use "false" as a separator for logical vector data types, and may use a null string (e.g., ' ' or " ") as a separator for string data types. Other types of separators and/or delimiters may alternatively be used.

As an example, and as shown in box 830, the Lat and Long vertex arrays may include values of a single vector or double vector data type, and NaN may be used as a separator value to separate properties indexed by different index values. In the Lat array, the values 70, 72, and 74, may be referenced by index value 1, while the values 30 and 40 may be referenced by index value 2. Additionally, the PointID and Temp vertex arrays may include values of an integer vector data type, and 0 may be used as a separator value to separate properties indexed by different index values. Additionally, the Landmark vertex array may include values of a string data type, and ' ' may be used as a separator value to separate properties indexed by different index values.

When creating an array in an object, class editor 410 may synchronize the length of vertex arrays and/or feature arrays. For example, the Lat array has a length of two, with index value 1 referring to {70, 72, 74} and index value 2 referring to {30, 40}. When the Long array is created, the source code only specifies values referenced by the index value of 1: {80, 82, 84}. Class editor 410 may use default fill values to synchronize the length of each feature array and vertex array (e.g., to synchronize the quantity of index values used by each array). For example, class editor 410 may use the fill values of {0, 0} for the index value of 2. When class editor 410 creates the Landmark vertex array, with a length of 3, class editor 410 may synchronize the length of the other vertex arrays to have a length of 3.

In addition to synchronizing the quantity of index values used by each vertex array, class editor 410 may use default fill values to synchronize the quantity of values referenced by each index value in the vertex array. For example, as shown in box 830, index value 1 references three values, index value 2 references two values, and index value 3 reference one value.

In some implementations, the default fill value may be based on the data type in the vertex array. In some implementations, class editor 410 may use 0 as a default fill value for single vector, double vector, and/or integer vector data types, may use "false" as a default fill value for logical vector data types, and may use a null string (e.g., ' ' or " ") as a separator for string data types.

Although FIG. 8 illustrates example information, such as source code and object properties, of implementation 800, some implementations may include additional information, less information, or different information than illustrated in FIG. 8.

Figure 9:
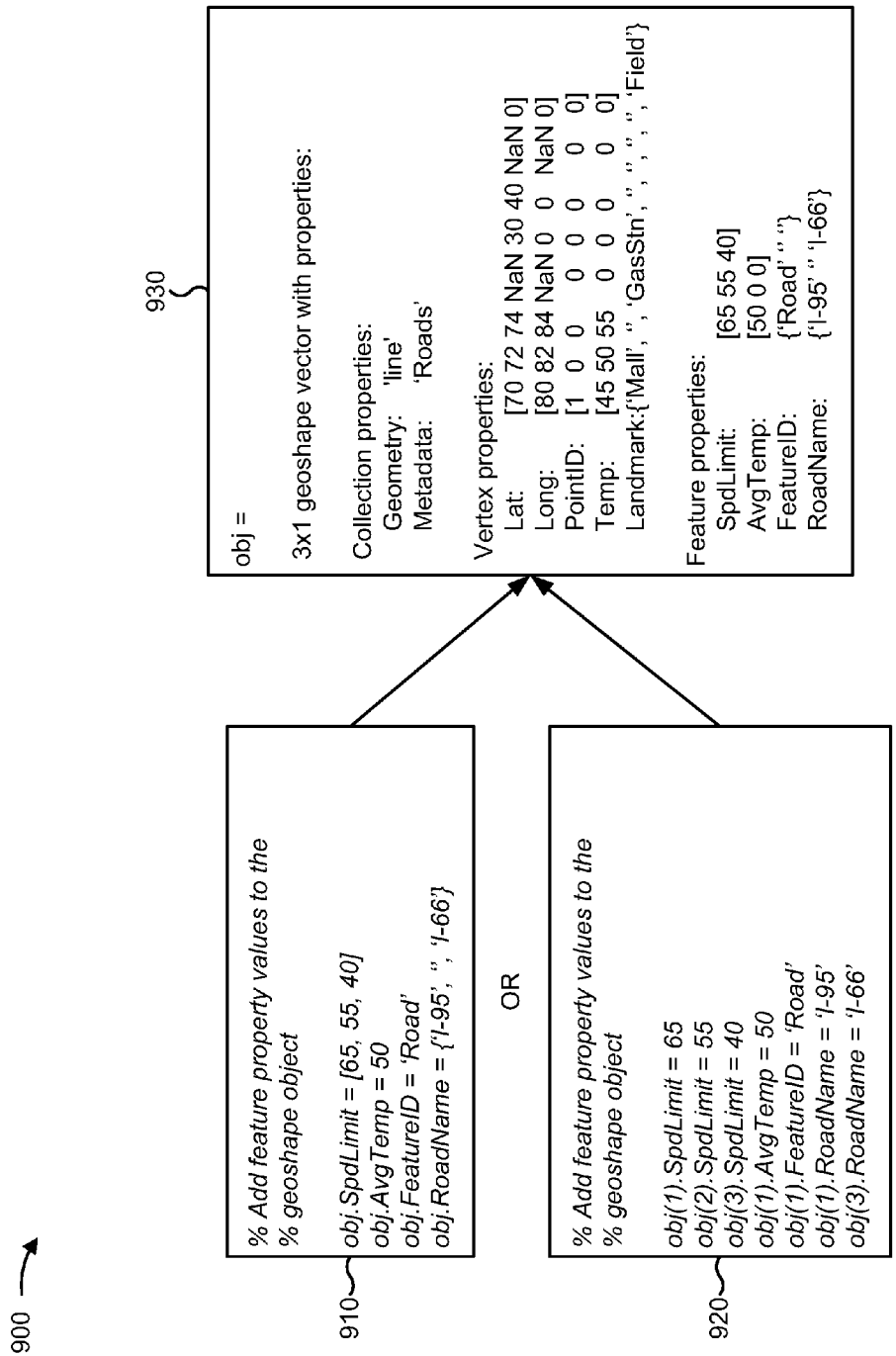

FIG. 9 is a diagram of an example implementation 900 relating to process 500, illustrated in FIG. 5. FIG. 9 illustrates an example implementation 900 for adding feature property values to a geoshape object.

As illustrated in FIG. 9, class editor 410 may use different source code syntax to add vertex properties to a dynamic vector class object, as shown in boxes 910-920. Class editor 410 may determine that the property to be added to the object is a vertex property based on the source code syntax. In some implementations, the source code may reference an object array without using an index value, as shown in box 910. Additionally, or alternatively, the source code may reference an element of the object array by using an index value, as shown in box 920. Code editor 410 may determine whether the property to be added is a vertex property or a feature property based on an intrinsic rule. The intrinsic rule may depend on whether the source code references an object array without using an index value (box 910) or references an element of the object array using an index value (box 920).

For example, when the source code references an object array without using an index value (box 910), code editor 410 may determine that the property value to be added to the object is a feature property when the value is a numeric, logical, or character scalar and/or vector:

obj.SpdLimit=[65, 55, 40]
obj.AvgTemp=50
obj.FeatureID='Road'.

Additionally, or alternatively, when the source code references an object array without using an index value (box 910), code editor 410 may determine that the property value to be added to the object is a feature property when the value is a cell array of strings:

obj.RoadName={'I-95', ' ', 'I-66'},

The result of adding these feature properties to the object is shown in the feature properties of box 930.

When the source code references an element of the object array by using an index value (box 920), code editor 410 may determine that the property value to be added to the object is a feature property when the value is a numeric or logical scalar value:

obj(1).SpdLimit=65
obj(2).SpdLimit=55
obj(3).SpdLimit=40
obj(1).AvgTemp=50.

Additionally, or alternatively, when the source code references an element of the object array by using an index value (box 920), code editor 410 may determine that the property value to be added to the object is a feature property when the value is a string:

obj(1).RoadName='I-95'
obj(3).RoadName='I-66'

The result of adding these feature properties to the object is shown in the feature properties of box 930.

In a feature array, each value in the feature array may be referenced by a different index value. For example, in the SpdLimit array, the value 65 may be referenced by index value 1, the value 55 may be referenced by index value 2, and the value 40 may be referenced by index value 3.

When creating an array in an object, class editor 410 may synchronize the length of vertex arrays and/or feature arrays. For example, the SpdLimit array has a length of three, with index value 1 referring to value 65, index value 2 referring to value 55, and index value 3 referring to value 40. When class editor 410 creates the AvgTemp array, the source code only specifies a value referenced by the index value of 1 (a value of 50). Class editor 410 may use default fill values to synchronize the length of each feature array and vertex array (e.g., to synchronize the quantity of index values used by each array). In some implementations, every feature array and vertex array may be synchronized to use the same quantity of index values. Additionally, or alternatively, each vertex array may be synchronized so that each index value references the same quantity of property values. In some implementations, each index value of a feature array may only be capable of referencing a single property value, so the quantity of property values referenced by each index value of a feature array may be synchronized by default.

As illustrated in box 930, vertex properties and/or feature properties may be stored as a concatenated array of values, rather than a comma-separated list of values. This provides an advantage to using a dynamic vector class object rather than other containers, such as a structure array. In a dynamic vector class object, using dot notation (e.g., obj.Lat) returns a concatenated array of values (e.g., [70 72 74 NaN 30 40 NaN 0]) rather than a comma-separated list of values (e.g., 70, 72, 74, 30, 40, 0).

Although FIG. 9 illustrates example information, such as source code and object properties, of implementation 900, some implementations may include additional information, less information, or different information than illustrated in FIG. 9.

Figure 10:
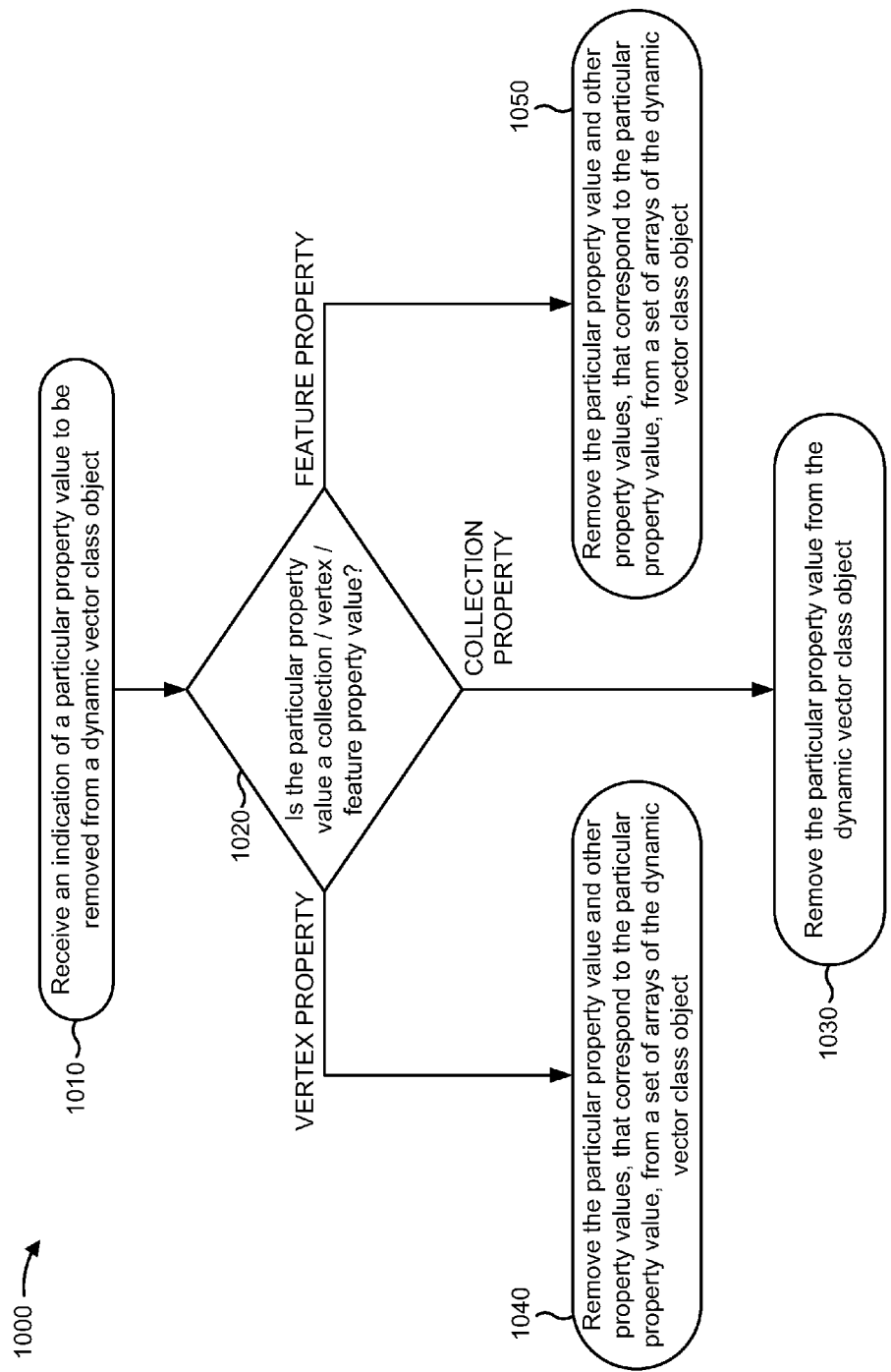
FIG. 10 is a flow chart of an example process relating to removing information from a dynamic vector class object.

FIG. 10 is a flow chart of an example process 1000 relating to removing information from a dynamic vector class object. In some implementations, process 1000 may be performed by a device, or a group of devices, separate from, or in combination with, computing device 210.

As shown in FIG. 10, process 1000 may include receiving an indication of a particular property value to be removed from a dynamic vector class object (block 1010). In some implementations, class editor 410 may receive, compile, and/or execute source code that indicates that a particular property value is to be removed from the dynamic vector class object.

As further shown in FIG. 10, process 1000 may include determining whether the particular property value is a collection, vertex, or feature property value (block 1020). In some implementations, class editor 410 may make the determination based on a property identified in the source code that provides the indication to remove the particular property value. For example, the source code may identify the property to be removed as a collection property, a vertex property, or a feature property.

If class editor 410 determines that the particular property value is a collection property value (block 1020—COLLECTION PROPERTY), process 1000 may include removing the particular property value from the dynamic vector class object (block 1030). For example, class editor 410 may remove a geometry property and/or a metadata property from the object.

If class editor 410 determines that the particular property value is a vertex property value (block 1020—VERTEX PROPERTY), process 1000 may include removing the particular property value and other property values, that correspond to the particular property value, from a set of arrays of the dynamic vector class object (block 1040). For example, class editor 410 may receive an indication to remove a vertex property, referenced by index value 2, from a vertex array of an object. Class editor 410 may remove the particular vertex property from the vertex array, and may remove other properties, from other vertex arrays and feature arrays of the object, referenced by index value 2. In this way, class editor 410 may synchronize the quantity of index values used by each array.

Additionally, or alternatively, class editor 410 may synchronize the quantity of values referenced by each index value in the vertex array. For example, if a particular index value references two values in a vertex array of an object, and class editor 410 receives an indication to remove the second value from the vertex array, class editor 410 may remove the second value from other vertex arrays of the object. Additionally, or alternatively, class editor 410 may replace the second value with a default value.

If class editor 410 determines that the particular property value is a feature property value (block 1020—FEATURE PROPERTY), process 1000 may include removing the particular property value and other property values, that correspond to the particular property value, from a set of arrays of the dynamic vector class object (block 1050). For example, class editor 410 may receive an indication to remove a feature property value, referenced by index value 1, from a feature array of an object. Class editor 410 may remove the particular feature property value from the feature array, and may remove other property values, from other feature arrays and vertex arrays of the object, referenced by index value 1. Additionally, or alternatively, class editor 410 may replace other property values with a default value. In this way, class editor 410 may synchronize the quantity of index values used by each array.

While a series of blocks has been described with regard to FIG. 10, the order of the blocks may be modified in some implementations. Additionally, or alternatively, non-dependent blocks may be performed in parallel.

Figure 11:
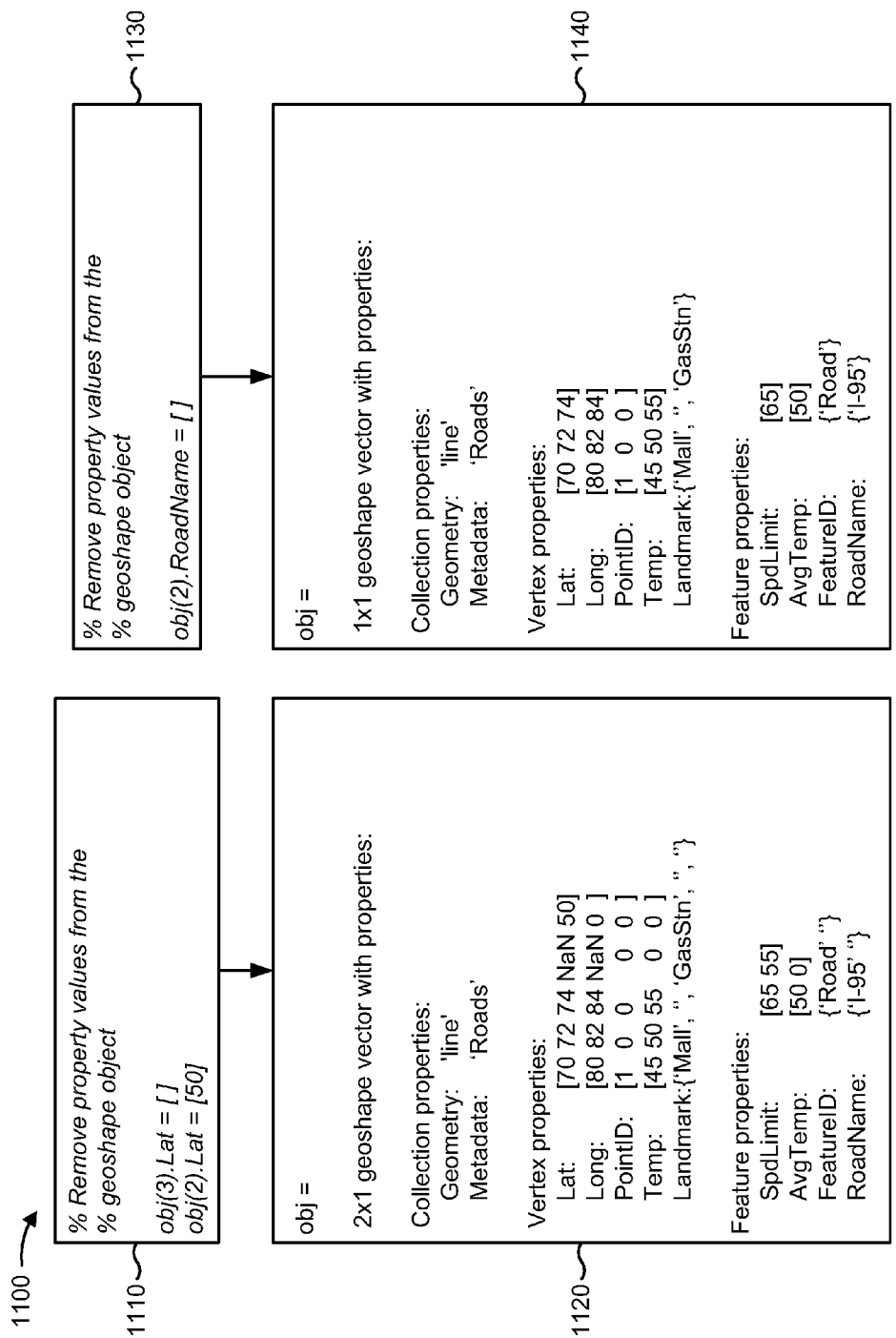
FIG. 11 is a diagram of an example implementation relating to the process illustrated in FIG. 10.

FIG. 11 is a diagram of an example implementation 1100 relating to process 1000, illustrated in FIG. 10. FIG. 11 illustrates an example implementation 1100 for removing property values from a geoshape object.

As illustrated in FIG. 11, the source code may specify a particular property value to be removed from the dynamic vector class object. For example, as shown in box 1110, the source code obj(3).Lat=[ ] may cause class editor 410 to remove all information referenced by index value 3 of the Lat vertex array. As shown in box 1120, the source code may also cause class editor 410 to remove all information referenced by index value 3 of each other vertex array (e.g., Long, PointID, Temp, and Landmark) and each feature array (e.g., SpdLimit, AvgTemp, FeatureID, and RoadName).

As another example, as shown in box 1110, the source code obj(2).Lat=[50] may case class editor 410 to replace the information referenced by index value 2 of the Lat array (previously the values 30 and 40, as shown in FIGS. 8 and 9), with the value 50. As shown in box 1120, because the quantity of values referenced by index value 2 in the Lat array has changed to reference one value, class editor 410 may edit the other vertex arrays (e.g., Long, PointID, Temp, and Landmark) so that index value 2 references one value. As further shown in box 1120, because index value 2 has not been removed from the array, class editor 410 may maintain (e.g., may not remove) the feature properties referenced by index value 2 in the feature arrays (e.g., SpdLimit, AvgTemp, FeatureID, and RoadName).

As shown in box 1130, the source code obj(2).RoadName=[ ] may cause class editor 410 to remove all information referenced by index value 2 of the RoadName feature array. As shown in box 1140, the source code may also cause class editor 410 to remove all information referenced by index value 2 of each other feature array (e.g., SpdLimit, AvgTemp, and FeatureID), and each vertex array (e.g., Lat, Long, PointID, Temp, and Landmark).

Although FIG. 11 illustrates example information, such as source code and object properties, of implementation 1100, some implementations may include additional information, less information, or different information than illustrated in FIG. 11.

Figure 12:
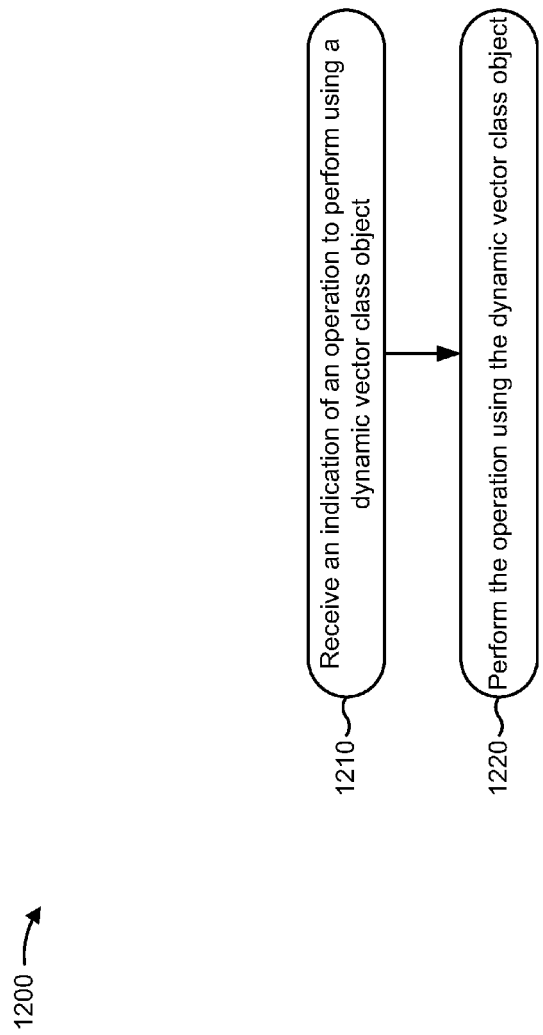
FIG. 12 is a flow chart of an example process relating to performing an operation using a dynamic vector class object.

FIG. 12 is a flow chart of an example process 1200 relating to performing an operation using a dynamic vector class object. In some implementations, process 1200 may be performed by a device, or a group of devices, separate from, or in combination with, computing device 210.

As shown in FIG. 12, process 1200 may include receiving an indication of an operation to perform using a dynamic vector class object (block 1210). In some implementations, class editor 410 may receive, compile, and/or execute source code that indicates a dynamic vector class object and an operation to perform on the dynamic vector class object. For example, the operation may be an instruction to plot information contained in the dynamic vector class object on a map and/or a coordinate plane.

As further shown in FIG. 12, process 1200 may include performing the operation using the dynamic vector class object (block 1220). For example, class editor 410 may perform the operation on the dynamic vector class object indicated by the source code, as described herein in connection with FIG. 13.

While a series of blocks has been described with regard to FIG. 12, the order of the blocks may be modified in some implementations. Additionally, or alternatively, non-dependent blocks may be performed in parallel.

Figure 13:
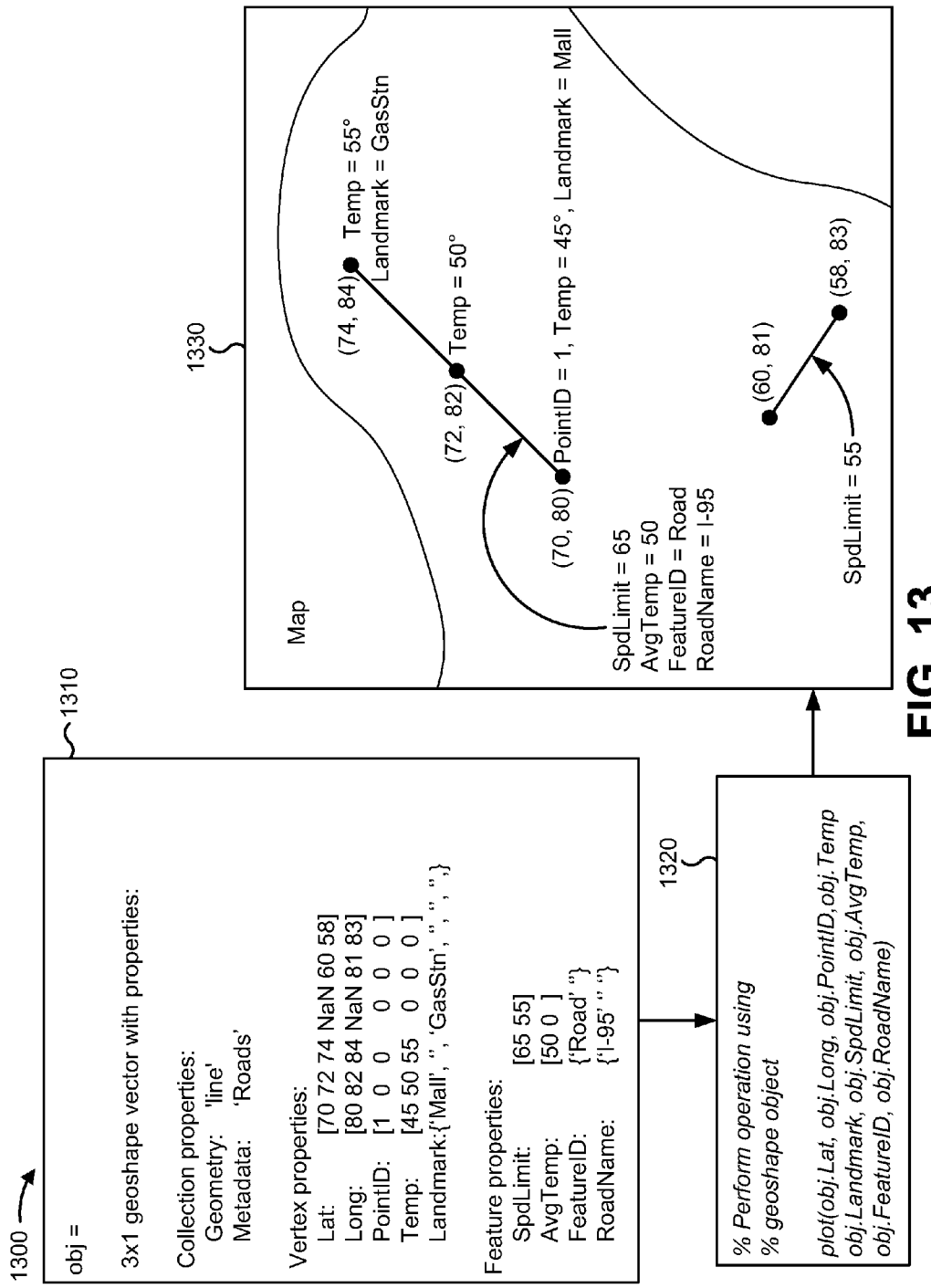
FIG. 13 is a diagram of an example implementation relating to the process illustrated in FIG. 12.

FIG. 13 is a diagram of an example implementation 1300 relating to process 1200, illustrated in FIG. 12. FIG. 13 illustrates an example implementation 1300 for plotting a geoshape object.

As shown in box 1310, a dynamic vector object may include vertex properties stored in vertex arrays, such as Lat, Long, PointID, Temp, and Landmark, and may include feature properties stored in feature arrays, such as SpdLimit, AvgTemp, FeatureID, and RoadName. The vertex properties and the feature properties may be associated with corresponding other vertex properties and other feature properties based on a common index value.

As shown in box 1320, class editor 410 may receive, compile, and/or execute source code that specifies an operation to perform on the dynamic vector class object. For example, the source code may specify a plot operation:

plot(obj.Lat, obj.Long, obj.PointID,obj.Temp obj.Landmark, obj.SpdLimit, obj.AvgTemp, obj.FeatureID, obj.RoadName).

As shown in box 1330, class editor 410 may perform the operation specified by the source code. For example, class editor 410 may plot information on a map using corresponding Lat and Long arrays, as well as other corresponding vertex and feature properties. For example, index value 1 corresponds to Lat values (70, 72, 74) and Long value (80, 82, 84). Class editor 410 may plot points at locations corresponding to Lat and Long coordinate pairs of (70, 80), (72, 82), and (74, 84). Because the geometry relationship of the object is a line relationship ("Geometry: 'line'), class editor 410 may connect the points with a line, as illustrated. Furthermore, class editor 410 may provide corresponding vertex property values at each point (e.g., PointID, Temp, and Landmark). If a corresponding vertex property value is empty (e.g., has a default fill value), then class editor 410 may not provide the corresponding vertex property value. Additionally, or alternatively, class editor 410 may provide corresponding feature property values in reference to all of the vertex property values referenced by index value 1 (e.g., SpdLimit=65, AvgTemp=50, FeatureID=Road, RoadName=1-95).

Although FIG. 13 illustrates example information, such as source code and object properties, of implementation 1300, some implementations may include additional information, less information, or different information than illustrated in FIG. 13.

The foregoing disclosure provides illustration and description, but is not intended to be exhaustive or to limit the embodiments to the precise form disclosed. Modifications and variations are possible in light of the above disclosure or may be acquired from practice of the embodiments. While certain portions of the description herein focused on mapping and/or plotting techniques, the techniques described herein are equally applicable to other operations.

As used herein, the term "component" is intended to be broadly construed as hardware, firmware, or a combination of hardware and software.

It will be apparent that systems and/or methods, as described herein, may be implemented in many different forms of software, firmware, and hardware in the implementations illustrated in the figures. The actual software code or specialized control hardware used to implement these systems and/or methods is not limiting of the implementations. Thus, the operation and behavior of the systems and/or methods were described without reference to the specific software code—it being understood that software and control hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A non-transitory computer-readable medium storing instructions, the instructions comprising:
   one or more instructions that, when executed by a processor, cause the processor to:
      store a data structure,
         the data structure comprising:
            information that identifies a geometric relationship between a first set of coordinate values, associated with a first data type, and a second set of coordinate values, associated with the first data type,
            a first array of a first length,
               the first array including the first set of coordinate values,
               the first length specifying a quantity of elements in the first array,
               a particular element, of the elements in the first array, including two or more of the first set of coordinate values,
               the first set of coordinate values including a first coordinate value, and
               the first coordinate value being located at a position, in the first array, identifiable by a reference value,
            a second array of a second length,
               the second array including the second set of coordinate values,
               the second length specifying a quantity of elements in the second array,
               the second set of coordinate values including a second coordinate value associated with the first coordinate value, and
               the second coordinate value being located at a position, in the second array, identifiable by the reference value, and
            a third array of a third length,
               the third array including a set of attribute values associated with a second data type,
               the second data type being different from the first data type,
               the third length specifying a quantity of elements in the third array,
               the set of attribute values including an attribute value associated with the first coordinate value and the second coordinate value, and
               the attribute value being located at a position, in the third array, identifiable by the reference value;
      receive a first indication that the first length, the second length, or the third length is to be modified; and
      modify, based on the first indication, the data structure so that the first length, the second length, and the third length are equivalent.

2. The non-transitory computer-readable medium of claim 1,
   where the one or more instructions to receive the first indication comprise:
      one or more instructions that, when executed by the processor, cause the processor to:
         receive a second indication that one of the first coordinate value, the second coordinate value, or the attribute value is to be removed from the data structure; and
   where the one or more instructions to modify the data structure comprise:
      one or more instructions that, when executed by the processor, cause the processor to:
         remove, based on the second indication, the first coordinate value, the second coordinate value, and the attribute value from the data structure.

3. The non-transitory computer-readable medium of claim 2, where the one or more instructions to remove the one of the first coordinate value, the second coordinate value, or the attribute value comprise:
   one or more instructions that, when executed by the processor, cause the processor to:
      determine a set of index values greater than the reference value,
         each index value, of the set of index values, being associated with one of the first coordinate value, the second coordinate value, or the attribute value; and
      decrement each index value of the set of index values.

4. The non-transitory computer-readable medium of claim 1,
   where the one or more instructions to receive the first indication comprise:
      one or more instructions that, when executed by the processor, cause the processor to:
         receive a third indication that an additional value is to be added to the data structure in an indicated array, the indicated array comprising one of the first array, the second array, or the third array; and
   where the one or more instructions to modify the data structure comprise:
      one or more instructions that, when executed by the processor, cause the processor to:
         add the additional value to the indicated array at a position identifiable by an additional index value, based on the third indication; and
         add a placeholder value to each of the first array, the second array, and the third array, other than the indicated array, at a position identifiable by the additional index value,
            the placeholder value being based on the first data type or the second data type.

5. The non-transitory computer-readable medium of claim 1, where the instructions further comprise:
   one or more instructions that, when executed by the processor, cause the processor to:
      output data structure information,
         the data structure information comprising at least one of:
            the first array that includes the first coordinate value, the first array being concatenated,
            the second array that includes the second coordinate value, the second array being concatenated, or
            the third array that includes the attribute value, the third array being concatenated.

6. The non-transitory computer-readable medium of claim 1, where the geometric relationship comprises one of:
   a point relationship where the first coordinate value and the second coordinate value represent a point that is not included in a line or a polygon;
   a line relationship where the first coordinate value and the second coordinate value represent a point that is included in a line; or
   a polygon relationship where the first coordinate value and the second coordinate value represent a point that is included in a polygon.

7. The non-transitory computer-readable medium of claim 1, where the instructions further comprise:
one or more instructions that, when executed by the processor, cause the processor to:
create a plot on a graphical user interface,
the plot displaying the attribute value at a location represented by the first coordinate value and the second coordinate value.

8. The non-transitory computer-readable medium of claim 1, where the instructions further comprise:
one or more instructions that, when executed by the processor, cause the processor to:
receive an attribute associated with the first set of coordinate values and the second set of coordinate values; and
add information identifying the attribute to the data structure.

9. The non-transitory computer-readable medium of claim 1, where the instructions further comprise:
one or more instructions that, when executed by the processor, cause the processor to:
receive an index value;
output the first coordinate value,
the first coordinate value being located at a position, in the first array, identifiable by the index value;
output the second coordinate value,
the second coordinate value being located at a position, in the second array, identifiable by the index value; and
output the attribute value,
the attribute value being located at a position, in the third array, identifiable by the index value.

10. A device comprising:
one or more processors to:
store a data structure,
the data structure comprising:
information that identifies a geometric relationship between a first set of coordinate values, associated with a first data type, and a second set of coordinate values, associated with the first data type;
a first array of a first length,
the first array including the first set of coordinate values,
the first length specifying a quantity of elements in the first array,
a particular element, of the elements in the first array, including two or more of the first set of coordinate values,
the first set of coordinate values including a first coordinate value, and
the first coordinate value being located at a position, in the first array, identifiable by a reference value,
a second array of a second length,
the second array including the second set of coordinate values,
the second length specifying a quantity of elements in the second array,
the second set of coordinate values including a second coordinate value associated with the first coordinate value, and
the second coordinate value being located at a position, in the second array, identifiable by the reference value, and a third array of a third length,
the third array including a set of attribute values associated with a second data type,
the second data type being different from the first data type,
the third length specifying a quantity of elements in the third array,
the set of attribute values including an attribute value associated with the first coordinate value and the second coordinate value, and
the attribute value being located at a position, in the third array, identifiable by the reference value;
receive a first indication that the first length, the second length, or the third length is to be modified; and
modify, based on the first indication, the data structure so that the first length, the second length, and the third length are equivalent.

11. The device of claim 10, where the one or more processors, when receiving the first indication, are further to:
receive a second indication that one of the first coordinate value, the second coordinate value, or the attribute value is to be removed from the data structure; and
where the one or more processors, when modifying the data structure, are further to:
remove, based on the second indication, the first coordinate value, the second coordinate value, and the attribute value from the data structure.

12. The device of claim 11, where the one or more processors, when removing the first coordinate value, the second coordinate value, and the attribute value, are further to:
determine a set of index values greater than the reference value, each index value, of the set of index values, being associated with one of the first coordinate value, the second coordinate value, or the attribute value; and
decrement each index value of the set of index values.

13. The device of claim 10,
where the one or processors, when receiving the first indication, are further to:
receive a third indication that an additional value is to be added to the data structure in an indicated array,
the indicated array comprising one of the first array, the second array, or the third array; and
where the one or more processors, when modifying the data structure, are further to:
add the additional value to the indicated array at a position identifiable by an additional index value, based on the third indication; and
add a placeholder value to each of the first array, the second array, and the third array, other than the indicated array, at a position identifiable by the additional index value,
the placeholder value being based on the first data type or the second data type.

14. The device of claim 10, where the one or more processors are further to:
output data structure information,
the data structure information comprising at least one of:
the first array that includes the first coordinate value,
the first array being concatenated,
the second array that includes the second coordinate value,
the second array being concatenated, or
the third array that includes the attribute value,
the third array being concatenated.

15. The device of claim 10, where the geometric relationship comprises one of:
- a point relationship where the first coordinate value and the second coordinate value represent a point that is not included in a line or a polygon;
- a line relationship where the first coordinate value and the second coordinate value represent a point that is included in a line; or
- a polygon relationship where the first coordinate value and the second coordinate value represent a point that is included in a polygon.

16. The device of claim 10, where the one or more processors are further to:
- create a plot on a graphical user interface,
  - the plot displaying the attribute value at a location represented by the first coordinate value and the second coordinate value.

17. The device of claim 10, where the one or more processors are further to:
- receive an attribute associated with the first set of coordinate values and the second set of coordinate values; and
- add information identifying the attribute to the data structure.

18. The device of claim 10, where the one or more processors are further to:
- receive an index value;
- output the first coordinate value,
  - the first coordinate value being located at a position, in the first array, identifiable by the index value;
- output the second coordinate value,
  - the second coordinate value being located at a position, in the second array, identifiable by the index value; and
- output the attribute value,
  - the attribute value being located at a position, in the third array, identifiable by the index value.

19. A method comprising:
- storing a data structure,
  - storing the data structure being performed by a device, and
  - the data structure comprising:
    - information that identifies a geometric relationship between a first set of coordinate values, associated with a first data type, and a second set of coordinate values, associated with the first data type;
    - a first array of a first length,
      - the first array including the first set of coordinate values,
      - the first length specifying a quantity of elements in the first array,
      - a particular element, of the elements in the first array, including two or more of the first set of coordinate values,
      - the first set of coordinate values including a first coordinate value, and
      - the first coordinate value being located at a position, in the first array, identifiable by a reference value,
    - a second array of a second length,
      - the second array including the second set of coordinate values,
      - the second length specifying a quantity of elements in the second array,
      - the second set of coordinate values including a second coordinate value associated with the first coordinate value, and
      - the second coordinate value being located at a position, in the second array, identifiable by the reference value, and
    - a third array of a third length,
      - the third array including a set of attribute values associated with a second data type,
      - the second data type being different from the first data type,
      - the third length specifying a quantity of elements in the third array,
      - the set of attribute values includes an attribute value associated with the first coordinate value and the second coordinate value, and
      - the attribute value being located at a position, in the third array,
    - identifiable by the reference value;
- receiving a first indication that the first length, the second length, or the third length is to be modified,
  - receiving the first indication being performed by the device; and
- modifying, based on the first indication, the data structure so that the first length, the second length, and the third length are equivalent,
  - modifying the data structure being performed by the device.

20. The method of claim 19,
where receiving the first indication further comprises:
- receiving a second indication that one of the first coordinate value, the second coordinate value, or the attribute value is to be removed from the data structure; and where modifying the data structure further comprises:
- removing, based on the second indication, the first coordinate value, the second coordinate value, and the attribute value from the data structure.

* * * * *